(12) United States Patent
Swaminathan et al.

(10) Patent No.: US 6,329,939 B1
(45) Date of Patent: Dec. 11, 2001

(54) METHOD AND APPARATUS FOR MINIMIZING MISMATCH IN A COMPLEX FILTER

(75) Inventors: Ashok Swaminathan, Guelph; Edward William MacRobbie, Manotick; William Martin Snelgrove, Ottawa, all of (CA)

(73) Assignee: Philsar Semiconductor, Inc., Nepean (CA)

( * ) Notice: Subject to any disclaimer, the term of this patent is extended or adjusted under 35 U.S.C. 154(b) by 0 days.

(21) Appl. No.: 09/252,381

(22) Filed: Feb. 18, 1999

(30) Foreign Application Priority Data

Feb. 18, 1998 (CA) .................................................. 2229737

(51) Int. Cl.[7] ..................................................... H03M 3/00
(52) U.S. Cl. ........................... 341/143; 341/155; 327/58; 333/173
(58) Field of Search ..................................... 341/143, 155, 341/163, 166; 333/173; 327/58, 65, 554, 553, 337; 708/404, 408, 319

(56) References Cited

U.S. PATENT DOCUMENTS

| | | | |
|---|---|---|---|
| 3,881,100 | * 4/1975 | Works et al. | 708/404 |
| 4,067,014 | * 1/1978 | Wheeler et al. | 708/71 |
| 4,835,482 | * 5/1989 | Tamakoshi et al. | 327/554 |
| 5,134,401 | * 7/1992 | Mccarteny et al. | 341/143 |
| 5,140,325 | 8/1992 | Tsai-Chung et al. | 341/143 |
| 5,148,166 | 9/1992 | Ribner | 341/143 |
| 5,162,799 | * 11/1992 | Tanimoto | 341/143 |
| 5,233,551 | * 8/1993 | White | 708/408 |
| 5,283,578 | 2/1994 | Ribner | 341/143 |
| 5,311,370 | 5/1994 | Takayama | 360/9.1 |
| 5,381,357 | * 1/1995 | Wedgwood et al. | 708/319 |
| 5,392,043 | 2/1995 | Ribner | 341/143 |
| 5,442,353 | 8/1995 | Jackson | 341/143 |
| 5,444,414 | 8/1995 | Delano | 327/563 |
| 5,451,901 | 9/1995 | Welland | 330/133 |
| 5,574,452 | 11/1996 | Longo et al. | 341/143 |
| 5,608,400 | * 3/1997 | Pellon | 341/143 |
| 5,844,442 | 12/1998 | Brehmer | 330/258 |
| 6,225,928 | * 5/2001 | Green | 341/143 |

OTHER PUBLICATIONS

An Overview of Sigma–Delta Converters from the *IEEE Signal Processing Magazine*; Pervez M. Aziz, et al.; Jan. 1996; pp. 61–84.

Complex Bandpass ΔΣ Converter for Digital Radio; J. Jantzi, et al.; University of Toronto and Carleton University; pp. 453–456.

Performance of Complex Noise Transfer Functions In Bandwidth and Multi Band Sigma Systems from the *IEEE*; Pervez M. Aziz, et al.; Dept. of Electrical Engineering, Univ. of PA; 1995; pp. 641–644.

(List continued on next page.)

Primary Examiner—Peguy JeanPierre
Assistant Examiner—Jean B. Jeanglaude
(74) Attorney, Agent, or Firm—Thomas, Kayden, Horstemeyer & Risley, L.L.P.

(57) ABSTRACT

A complex filter minimizing mismatch error by averaging the mismatch error by integrating the real and imaginary input signals using the same integrator. A further advantage is that, as compared to known devices, the complex filter uses fewer number of components thereby reducing the consumed power. The complex filter may be used in a complex bandpass sigma-delta modulator, thereby increasing the performance of the sigma-delta modulator. The complex filter used in a sigma-delta modulator analog to digital converter increases performance of the analog to digital conversion since the mismatch noise is minimized. The complex bandpass sigma-delta modulator analog to digital converter include any number of complex filter stages.

24 Claims, 9 Drawing Sheets

OTHER PUBLICATIONS

The Effects of Mismatch in Complex Bandpass Modulators; S. A. Jantzi, et al.; The University of Toronto, Dept. of Electrical and Computer Eng.; 1996; pp. 227–230.

Complex–signal sigma–delta modulators for quadrature bandpass A/D conversion from the *Microelectronics Journal* 27; Victor da Fonte Dias; 1996; pp. 505–524.

Fenk et al., "Low–noise, low–voltage, low–power IF gain controlled amplifiers for wireless communication," Siemens AG, 1996, pp. 27–45.

Crols et al., "Low–IF Topologies for High–Performance Analog Front Ends of Fully Integrated Receivers, " IEEE Trans. on Circuits and Systems II–Analog and Digital Signal Processing, vol. 45, No. 3, Mar. 1998, pp. 269–282.

Crawley et al., "Designing Operational Transconductance Amplifiers for Low Voltage Operation, " IEEE International Symposium on Circuits and Systems, May 1993, pp. 1455–1458.

* cited by examiner

METHOD AND APPARATUS FOR MINIMIZING MISMATCH IN A COMPLEX FILTER

FIELD OF INVENTION

The present invention relates to minimizing mismatch in a complex filter, and more specifically to minimizing mismatch in a complex feedforward loop filter in a complex sigma-delta modulator.

BACKGROUND OF THE INVENTION

Digital processing of signals is usually more cost effective and provides higher performance than analog processing. Analog to digital (A/D) converters, therefore, are used in many systems. Many modern radio systems, for example, use digital signal processing techniques to achieve higher performance, and as such, require high performance analog to digital converters.

There are a number of different analog to digital (A/D) converters known in the art, such as flash A/D, successive approximation, pulse code modulation (PCM) conversion, oversampled PCM conversion, and sigma-delta modulation A/D conversion. Generally speaking, the best performance is achieved by sigma-delta modulation techniques.

Sigma-delta modulation A/D conversion achieves higher resolution than many of the other techniques. In essence, sigma-delta modulation improves the resolution by increasing the signal to noise ration (SNR) in the A/D converter, which results in increased resolution. The SNR increases due to oversampling, which spreads the noise over a large bandwidth, and due to a complex feedforward loop filter, which further reduces the noise in the band of interest by forcing some of the inband noise out of band. The extra performance of sigma-delta modulation A/D converters is obtained at the expense of high circuit speeds as compared to other A/D converters. This being the case, however, by using a complex transfer function for the complex feedforward loop filter the circuit speed requirements are less as compared to using a real transfer function. A complex sigma-delta modulation A/D converter uses such a complex filter.

Typical complex sigma-delta modulation A/D converter performance has been limited by mismatches in the circuit technology. In complex sigma-delta modulation A/D converters there are effectively two separate channels for the real and imaginary inputs to the complex feedforward loop filter. Any mismatch between the two channels causes the signals at the negative frequencies to 'fold' into the desired signal band, which degrades performance. Therefore, and image frequency can be aliased on top of the desired signal.

Therefore, in order to exploit the high resolution and moderate circuit speed achieved by complex sigma-delta modulation A/D converters, a method and apparatus for minimizing the mismatch in the complex feedforward loop filter is needed.

SUMMARY OF THE INVENTION

The invention is directed to a method and apparatus for minimizing the mismatch in a complex filter.

An advantage of the invention is minimized mismatch error caused by imperfections in the complex filter, thereby enhancing the performance of the complex filter.

According to the invention, there is provided a complex filtering method in a complex filter having at least two stages and at least one mismatch error after the first stage. The method includes the step of averaging the mismatch error by integrating a real input signal and an imaginary input signal using a single integrator.

Another embodiment of the invention is a complex filter including means for implementing a transfer function substantially equal to $$\frac{1+jz^{-1}}{1-jz^{-1}}.$$

BRIEF DESCRIPTION OF THE DRAWINGS

These and other features, aspects, and advantages of the present invention will become more apparent from the following description, appended claims, and accompanying drawings where:

Similar reference numerals refer to similar elements throughout the figures and detailed descriptions.

DETAILED DESCRIPTION

The invention relates to an improved complex filter and method for complex filtering. The improved complex filter can be used as an improved complex feedforward loop filter in a complex bandpass sigma-delta modulator resulting in fewer overall components and thus being comparatively more power efficient than other devices known in the art. Also, the improved complex filtering is a technique to compensate for circuit imperfections that can adversely affect the performance of the complex sigma-delta modulator when used in an analog to digital converter.

Figure 1:
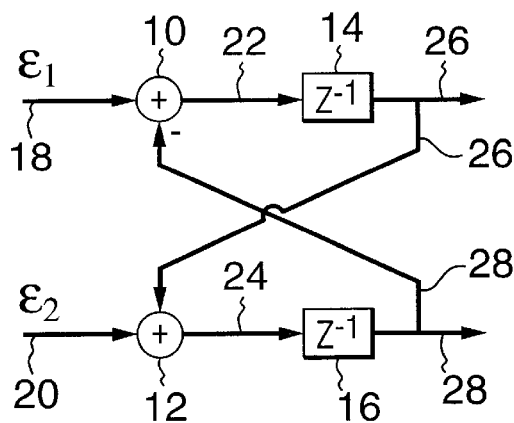
FIG. 1 is a block diagram of a complex filter for sigma-delta modulator as known in the art.
Figure 2:
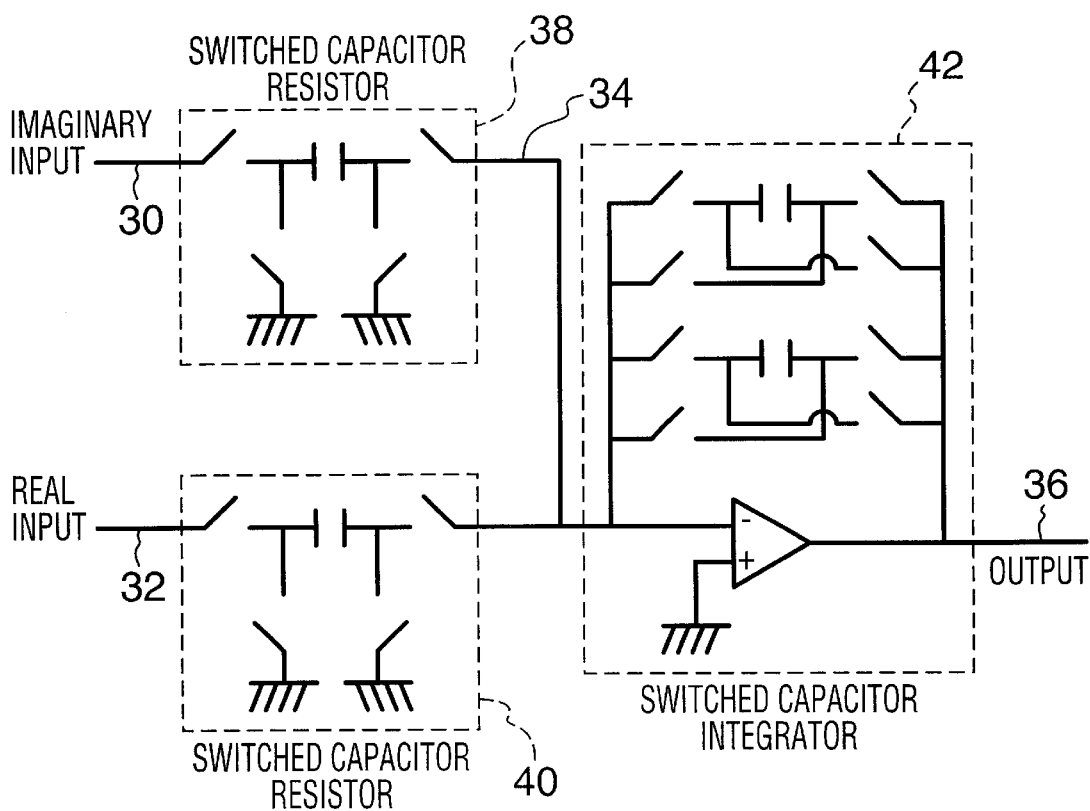
FIG. 2 is a block diagram of a complex filter for sigma-delta modulator as known in the art.

Generally speaking, a known complex bandpass sigma-delta modulator comprises two real filters, one for each of the imaginary and real channels, that are coupled together as shown in FIG. 1. The circuit implementing this is shown in FIG. 2. By exploiting the fact that the output of each channel depends on the previous value of the other channel, and its input, the same opamp circuit is used to perform the operation for both the real and imaginary channel.

A complex bandpass sigma-delta modulator is basically and inphase/quadrature (I/Q) system. It is well known that any mismatch in I/Q systems causes 'images' to be created within the desired signal band. If the complex term is perfectly accurate, then no image appears inside the signal. But for any non-idealities in the circuit that implements this function, the image appears in the signal and can easily be more powerful than the desired signal. In a complex bandpass sigma-delta modulator, the effect is even worse, in the A/D converter has an input that consists of both a signal, and quantization noise. For any mismatch, this quantization noise can show up within the signal band, which can degrade the quality of the A/D converter.

One way around this is to feed both the real and imaginary (I and Q) parts of the signal into both paths. Since the same input goes through both paths, the mismatch error is minimized to first-order approximation. Therefore, it uses the same output from the analog to digital converter and feeds it back through both channels in order to negate the circuit imperfections that can degrade performance.

A further advantage is that both channels are implemented as one circuit element instead of two, which uses half the power.

Embodiments of the invention may be designed using a discrete time switched-capacitor (SC) circuit in a BiCMOS process. The invention can be incorporated into many mainstream CMOS processes, and with some small modifications, can be built with a continuous time filter for high-speed applications.

With reference to FIGS. 3 to 7, the structure of the invention is now described.

Figure 3:
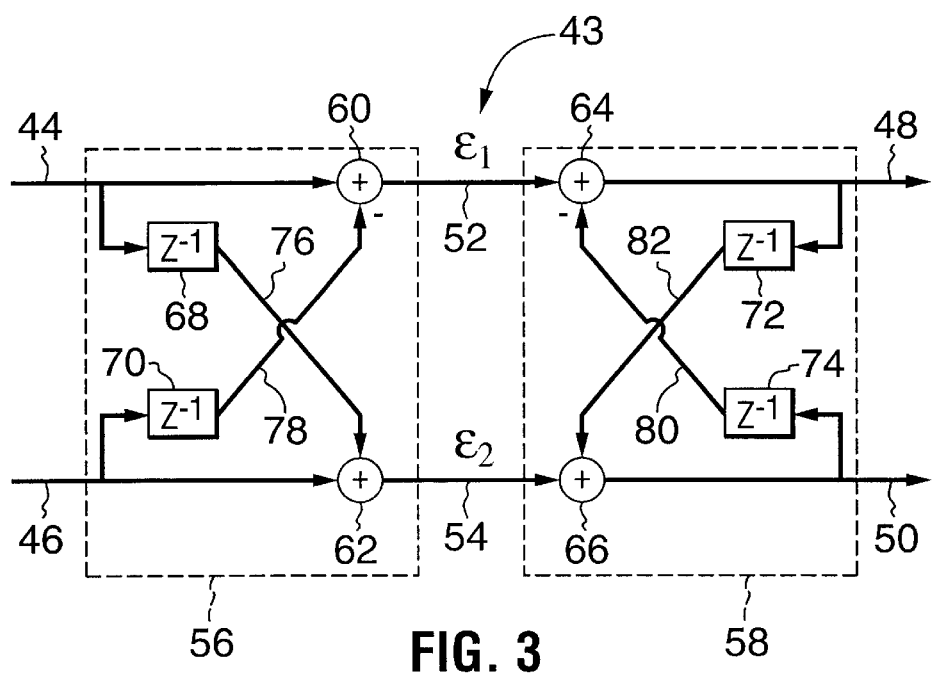
FIG. 3 is a block diagram of a complex filter according to an embodiment of the invention.

FIG. 3 illustrates a block diagram of a complex filter according to an embodiment of the invention. The complex filter includes means 43 for implementing a transfer function substantially equal to $$\frac{1+jz^{-1}}{1-jz^{-1}}.$$

The complex filter includes a first input signal 44, a second input signal 46, a first output signal 48 and a second output signal 50. The complex filter also includes a first stage 56 and second stage 58.

The first stage 56 is responsive to the first input signal 44 and the second input signal 46. The first stage 56 produces a first interstage signal with error 52 and a second interstage signal with error 54. The first stage 56 includes a first delay element 68 and a second delay element 70. The first delay element 68 is responsive to the first input signal 44 and produces a first delayed signal 76. The second delay element 70 is responsive to the second input signal 46 and produces a second delayed signal 78.

The first stage 56 also includes a first summer 60 and a second summer 62. The first summer 60 is responsive to the first input signal 44 and the second delayed signal 78 and producing the first interstage signal with error 52. The first interstage signal with error 52 is substantially equal to the first input signal 44 minus the second delayed signal 78. The second summer 62 is responsive to the second input signal 46 and the first delayed signal 76 and produces the second interstage signal with error 54. The second interstage signal with error 54 is substantially equal to the second input signal 46 plus the first delayed signal 76.

The second stage 58 is responsive to the first interstage signal with error 52 and the second interstage signal with error 54. The second stage 58 produces the first output signal 48 and the second output signal 50. The second stage 58 includes third delay element 72 and a fourth delay element 74. The third delay element 72 is responsive to the first output signal 48 and produces a third delayed signal 82. The fourth delay element 74 is responsive to the second output signal 50 and produces a fourth delayed signal 80.

The second stage 58 also includes a third summer 64 and a fourth summer 66. The third summer 64 is responsive to the first interstage signal with error 52 and the fourth delayed signal 80. The third summer 64 produces the first output signal 48. The first output signal 48 is substantially equal to the first interstage signal with error 52 minus the fourth delayed signal 80. The fourth summer 66 is responsive to the second interstage signal with error 54 and the third delayed signal 82. The fourth summer 66 produces the second output signal 50. The second output signal 50 is substantially equal to the second interstage signal with error 54 plus 54 the third delayed signal 82.

Figure 4:
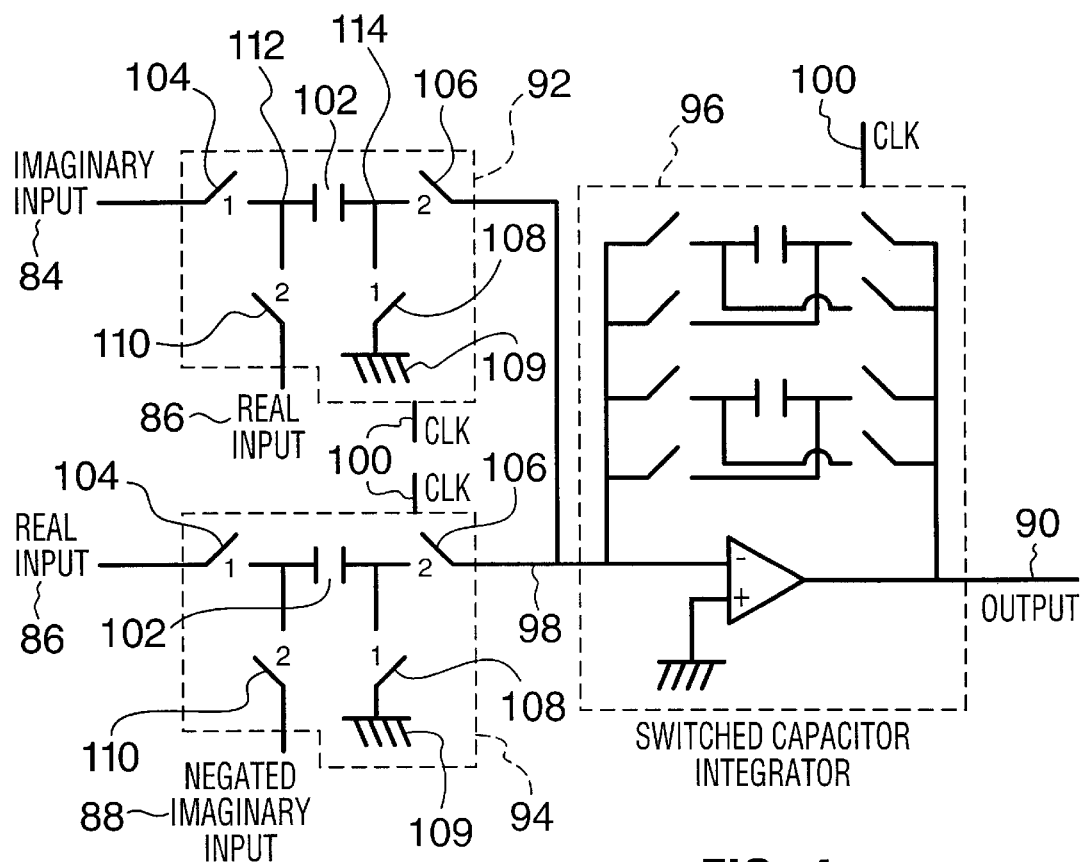
FIG. 4 is a block diagram of a complex filter according to an embodiment of the invention.

The circuit topology is chosen such that there is no mismatch error anywhere in the circuit except for $\epsilon_1$ & $\epsilon_2$, which represents the error in the real & imaginary paths. The complex input goes through a first stage in the improved complex filter block. The cross coupling gives it a transfer function that is $1+jz^{-1}$. The error due to mismatch can be shown as two distinct errors, $\epsilon_1$ & $\epsilon_2$, that show up in the real, and imaginary paths respectively after the first stage of the complex filter block In a known complex filter block (as seen in FIG. 1 having a transfer function of $(1/[1-jz^{-1}])$, the error is directly at the input, and therefore the output of the complex filter block is directly degraded by the amount of the error $\epsilon_1$ & $\epsilon_2$. This error has the effect of mixing any signals that appear at a complex frequency of $-f_s/4$ (where $f_s$ is the sampling rate of the complex filter block) to $f_s/4$, hence degrading its performance. In an embodiment of the invention, the error is only seen after the first stage, which has a transfer function that effectively attenuates all signals at $-f_s/4$, meaning that there are no interfering signals at $-f_s/4$ to mix into the desired signal band FIG. 4 illustrates a circuit diagram of a complex filter according to an embodiment of the invention. The complex filter includes an imaginary input signal 84, a real input signal 86, a negated imaginary input signal 88, and integrated output signal 90 and a clock signal 100. The complex filter also includes a first dual switched capacitor resistor 92, a second dual switched capacitor resistor 94 and a switched capacitor integrator 96. The switched capacitor integrator 96 is well known in the art.

The first dual switched capacitor resistor 92 is responsive to the clock signal 100, the imaginary input signal 84 and the real input signal 86. The first dual switched capacitor resistor 92 produces a switched capacitor integrated input signal 98. The second dual switched capacitor resistor 94 is responsive to the clock signal 100, the real input signal 86 and the negated imaginary input signal 88. The second dual switched capacitor resistor 94 produces the switched capacitor integrated input signal 98.

The switched capacitor integrator 96 is responsive to the clock signal 100 and the switched capacitor integrated input signal 98. The switched capacitor integrator 96 produces the integrated output signal 90.

The first dual switched capacitor resistor 92 includes a capacitor 102, a first switch 104, a second switch 106, a third switch 108 and fourth switch 110. The capacitor 102 has first capacitor terminal 112 and a second capacitor terminal 114. The first switch 104 is connected between the imaginary input signal 84 and the first capacitor terminal 112. The second switch 106 is connected between the second capacitor terminal 114 and the switched capacitor integrator input signal 98. The third switch 110 is connected between the real input signal 86 and the first capacitor input terminal 112. The fourth switch 108 is connected between ground 109 and the second capacitor terminal 114. The first 104 and the fourth 108 switches respond to one phase of the clock signal 100 and the second 106 and the third 110 switches respond to the other phase of the clock signal 100.

The second dual switched capacitor resistor 94 is identical to the first dual switched capacitor resistor 92 except in the following instances. The real input signal 86 is connected to the first switch 104 and the negated imaginary input signal 88 is connected to the third switch 110.

The imaginary input gets sample onto the first capacitor on one phase of the clock. At the same time, the imaginary input is connected to the second capacitor, which is then dumped through the switched capacitor (SC) integrator. The next clock cycle, the first capacitor is connected to the real input, and dumped through the SC integrator on the other phase of the clock. At the same time, the real input is connected to the second capacitor. This whole operation creates the first stage of the complex filter block in FIG. 3. The opamp, and capacitors around it represent the second stage of the complex filter block shown FIG. 3. During one phase of the clock, the output of the complex filter block is processing the 'real' value of the complex output, and during the other phase of the clock, the output of the block is processing the 'imaginary' value. Since each real output depends on the previous imaginary output, and vice versa, two capacitors are needed; used to calculate alternate values of the imaginary output, then immediately used to calculate the next real output on the next clock cycle.

Figure 5:
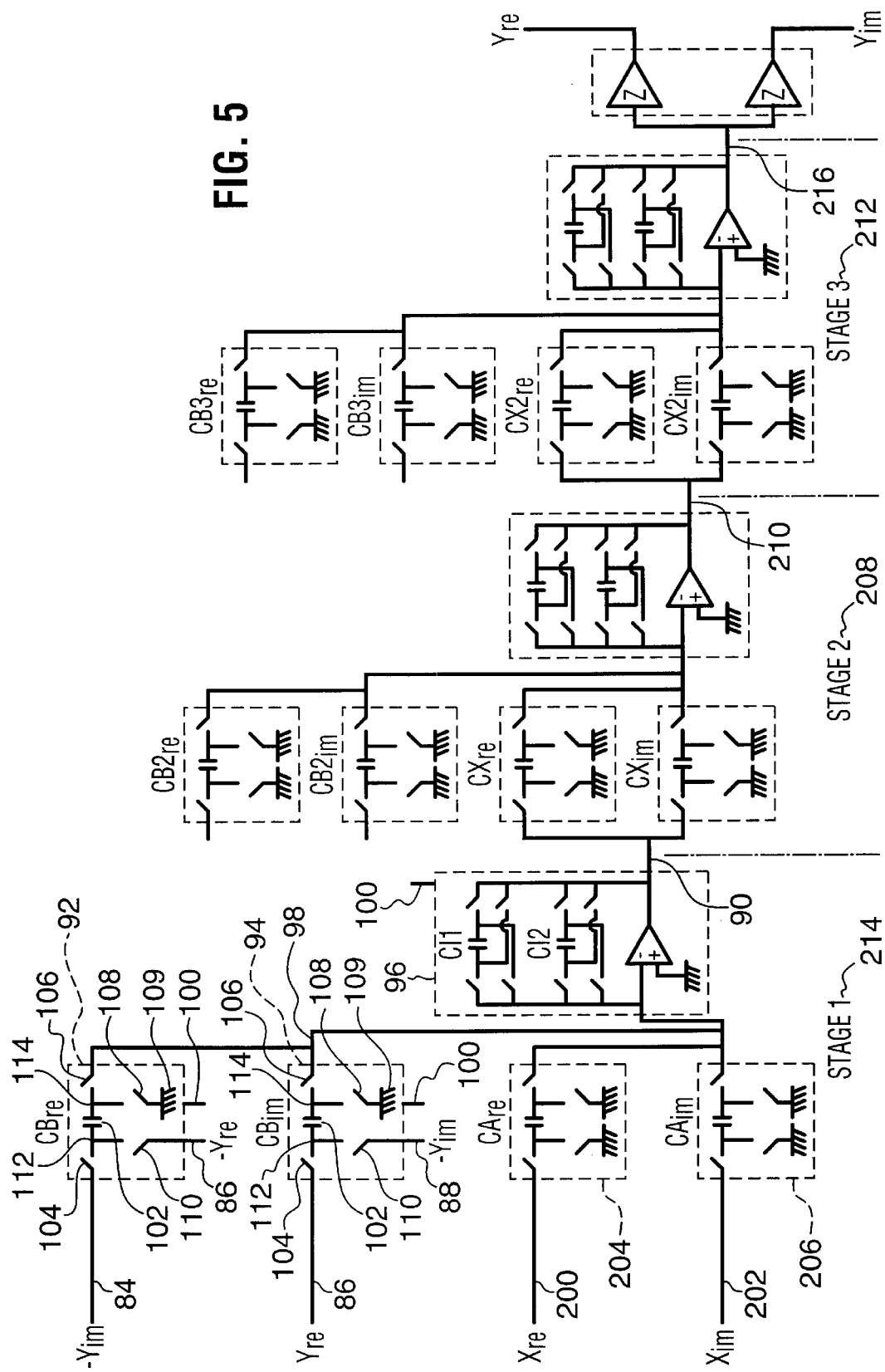
FIG. 5 is a block diagram of a complex filter according to an embodiment of the invention.

FIG. 5 illustrates a circuit diagram of a complex filter according to an embodiment of the invention. The complex filter includes a real feedback signal 200, an imaginary feedback signal 202, a first switched capacitor resistor 204 and a second switched capacitor resistor 206. The first switched capacitor resistor 204 is responsive to the real feedback signal 200 and produces the switched capacitor integrator input signal 98. The second switched capacitor resistor 206 is responsive to the imaginary feedback signal 202 and produces the switched capacitor integrator input signal 98.

The first dual switched capacitor resistor 204 and the second dual switched capacitor resistor 206 are switched capacitor resistors as known in the art.

The complex filter also includes a first intermediate filter state 208. The first intermediate filter stage is responsive to the switched capacitor integrator output signal 90 and produces a first intermediate filter stage output signal 210.

The complex filter also includes a second intermediate filter stage 212. The second intermediate filter stage 212 is responsive to the first intermediate filter stage output signal 210 and produces a quantizer input signal 216.

The first intermediate filter stage 208 and the second intermediate filter stage 212 are in FIG. 5 as complex filter known in the art, however, one or more first stages 214 could also be used. This embodiment of the invention may be used in a multiple stage complex filter, however, generally it is simple to use an embodiment of the invention as the first stage 214 and known complex filters for the remaining stages, if any.

The first stage includes the complex filter block similar to the that illustrated in FIG. 4 except with two inputs: one for the input into the circuit, and another for the feedback from the output of the quantizer. Each subsequent stage can be (but is not limited to) the same complex filter block. For simplicity, in FIG. 5 each of the two subsequent stages does not have the error reduction circuitry of the invention. There are two output comparators for the 'real' and 'imaginary' channels of the complex A/D. These can also be n-bit A/D converters, and are not limited to comparators. The outputs from the comparators are fed back into each complex filter block.

Figure 6:
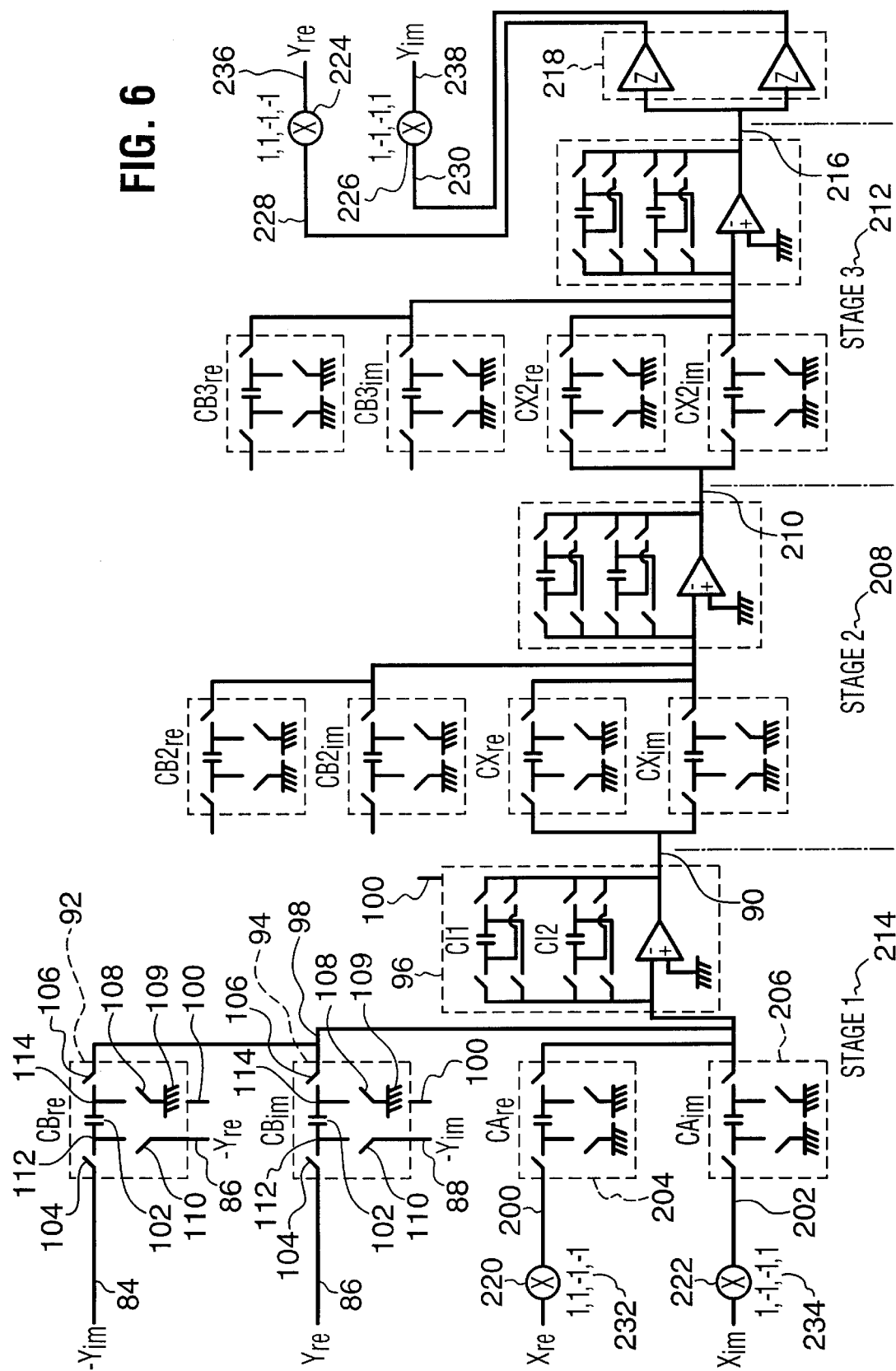
FIG. 6 is a block diagram of a complex filter according to an embodiment of the invention.

FIG. 6 illustrates a circuit diagram of a complex filter according to an embodiment of the invention. The complex filter includes the elements shown in FIG. 5 and also a quantizer 218, a first digital multiplier 220, a second digital multiplier 222, a third digital multiplier 224 and a fourth digital multiplier 226. The quantizer 218 is responsive to the quantizer input signal 216 and produces a real quantized output signal 228 and an imaginary quantized output signal 230.

The first digital multiplier 220 is responsive to the first digital multiplier input signal 232 and produces the real feedback signal 200. The second digital multiplier 222 is responsive to the second digital multiplier 234 input signal and produces the imaginary feedback signal 202. The third digital multiplier 224 is responsive to the real quantized output signal 228 and produces a third digital multiplier output signal 236. The fourth digital multiplier 226 is responsive to the imaginary quantized output signal 230 and produces a fourth digital multiplier output signal 238.

The difference between FIGS. 5 and 6 is that the SC integrators are switched differently and as a result the digital mixers are placed at the input and output. In other words, the operation of flipping the capacitor around each stage is moved to the inputs and outputs of the A/D converter. The advantage of FIG. 6 is that it is a slightly more efficient structure than FIG. 5, and it is not sensitive to parasitics capacitances on circuit nodes.

Figure 7:
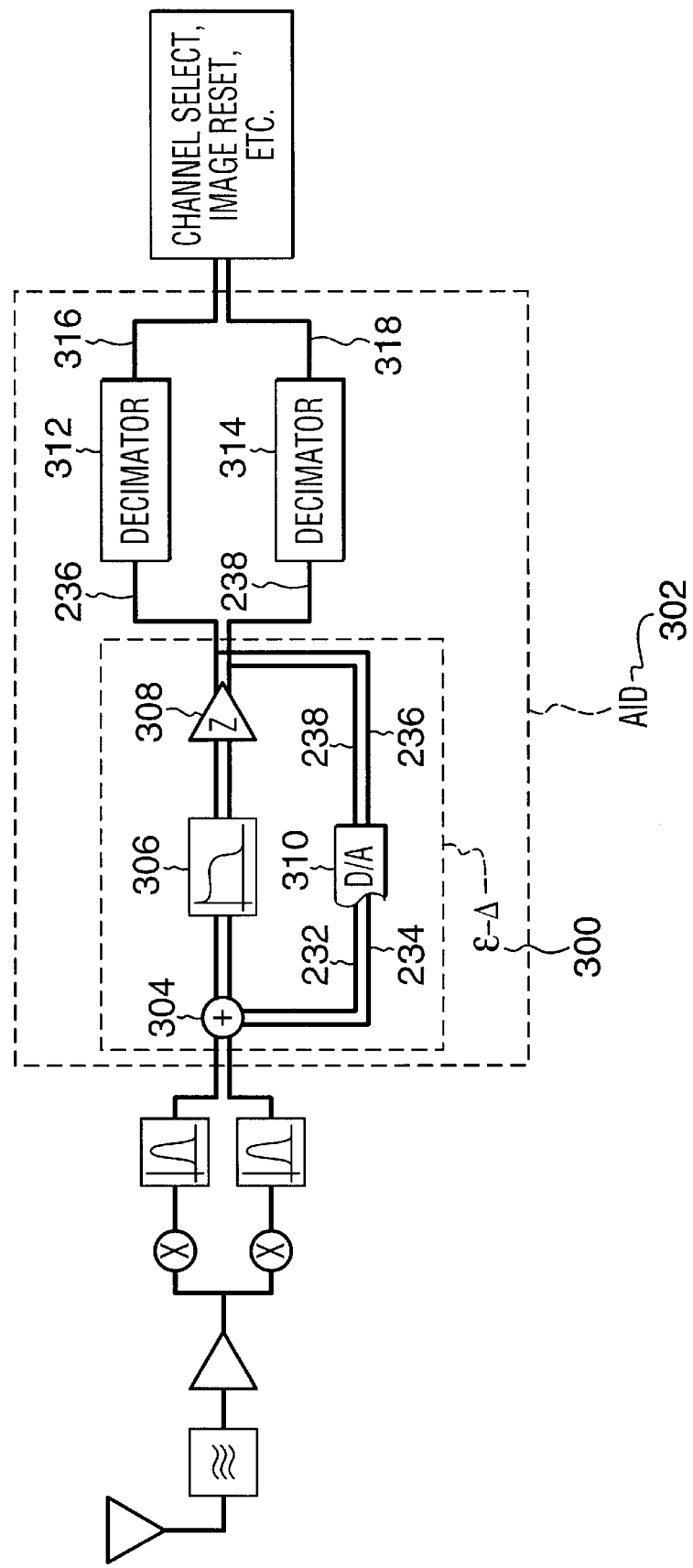
FIG. 7 is a block diagram of a sigma-delta modulation analog to digital converter according to an embodiment of the invention.
Figure 8:
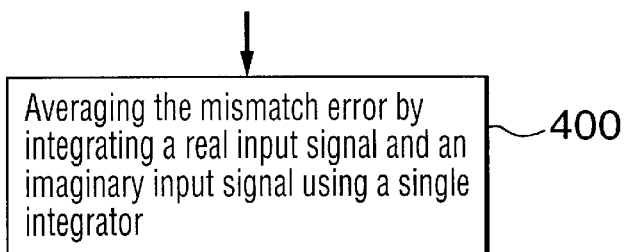
FIG. 8 is a flow chart of complex filtering method according to an embodiment of the invention.
Figure 9:
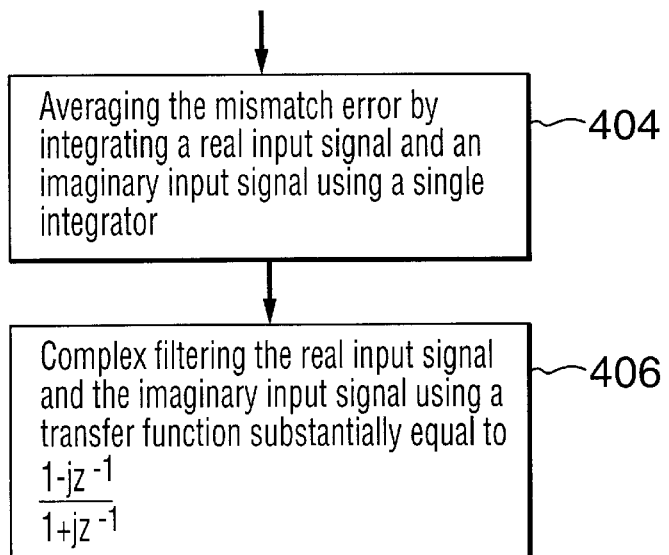
FIG. 9 is a flow chart of complex filtering method according to an embodiment of the invention.
Figure 10:
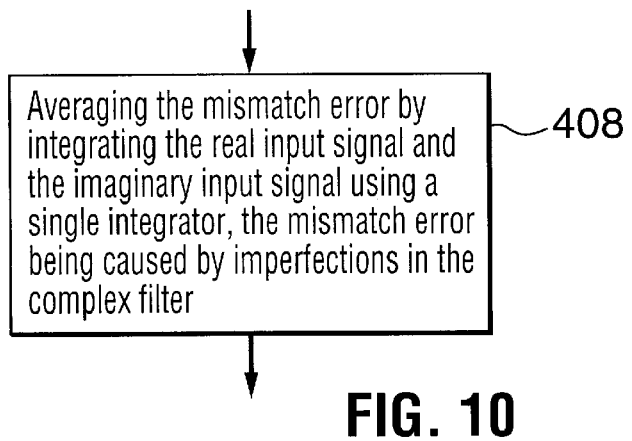
FIG. 10 is a flow chart of complex filtering method according to an embodiment of the invention.
Figure 11:
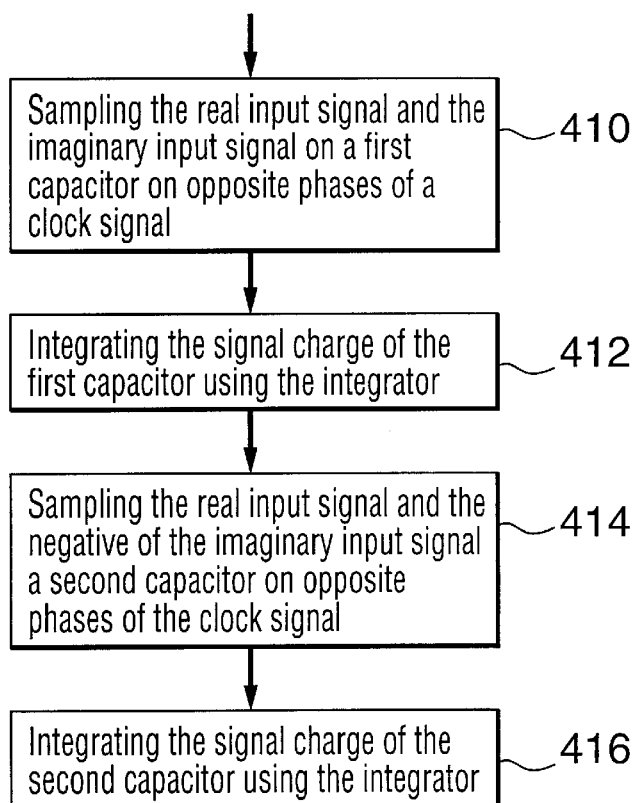
FIG. 11 is a flow chart of complex filtering method according to an embodiment of the invention.
Figure 12:
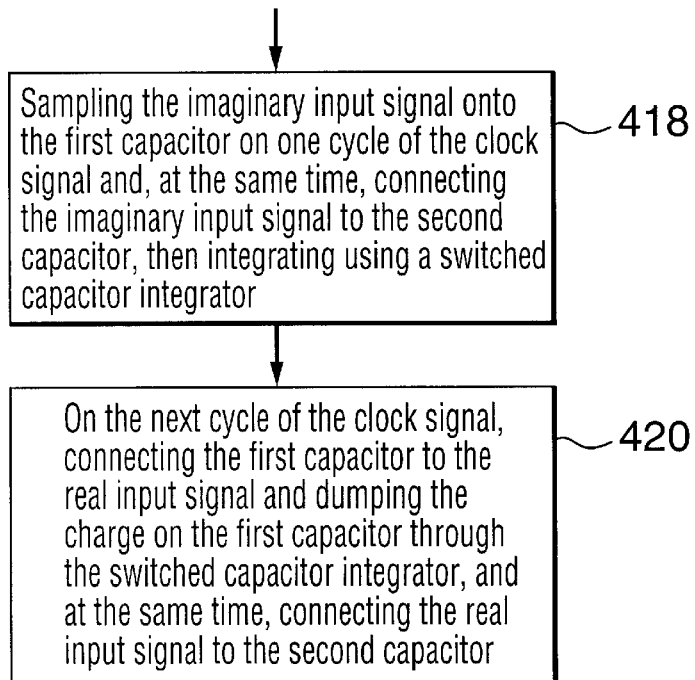
FIG. 12 is a flow chart of complex filtering method according to an embodiment of the invention.
Figure 13:
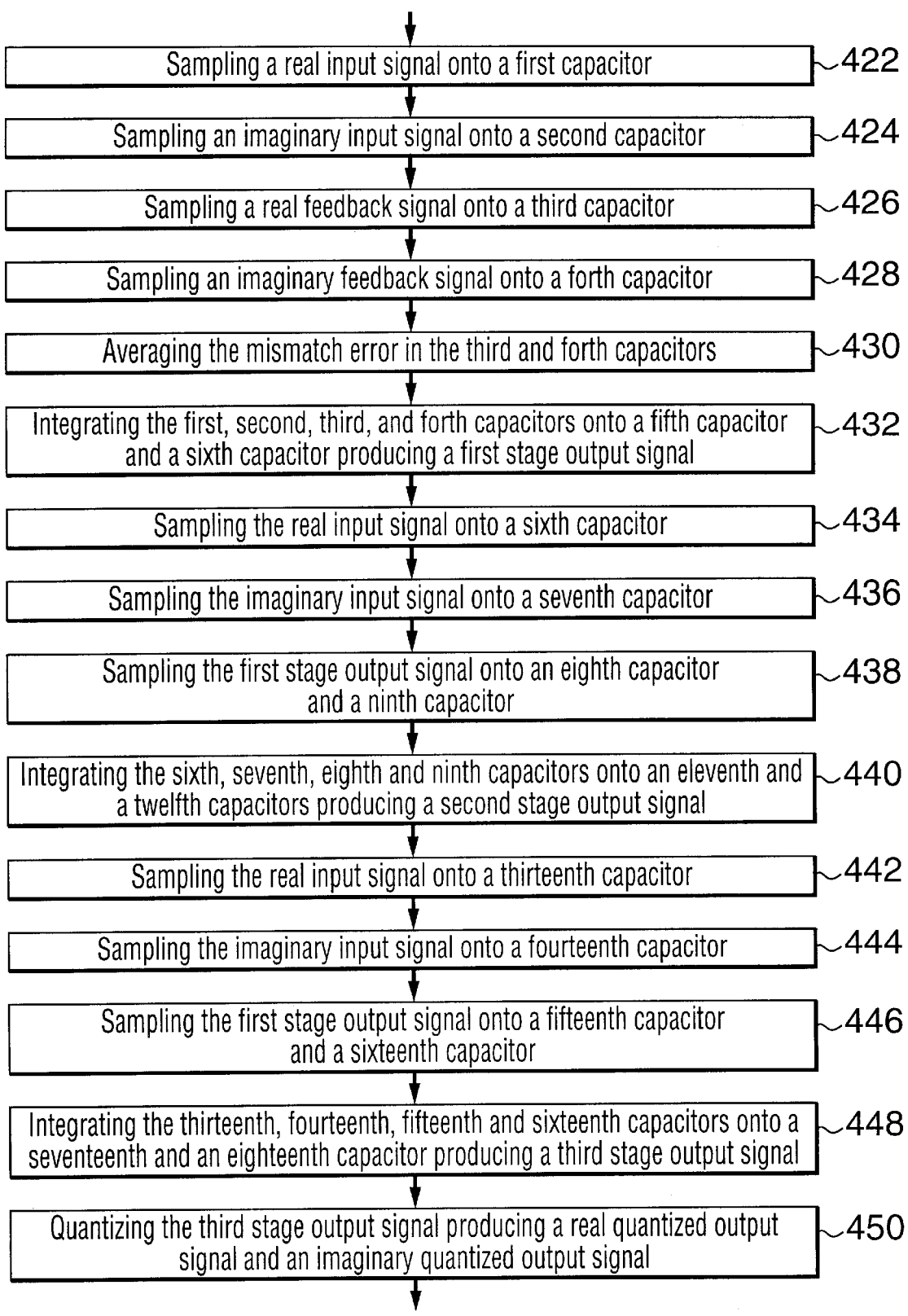
FIG. 13 is a flow chart of complex filtering method according to an embodiment of the invention.
Figure 14:
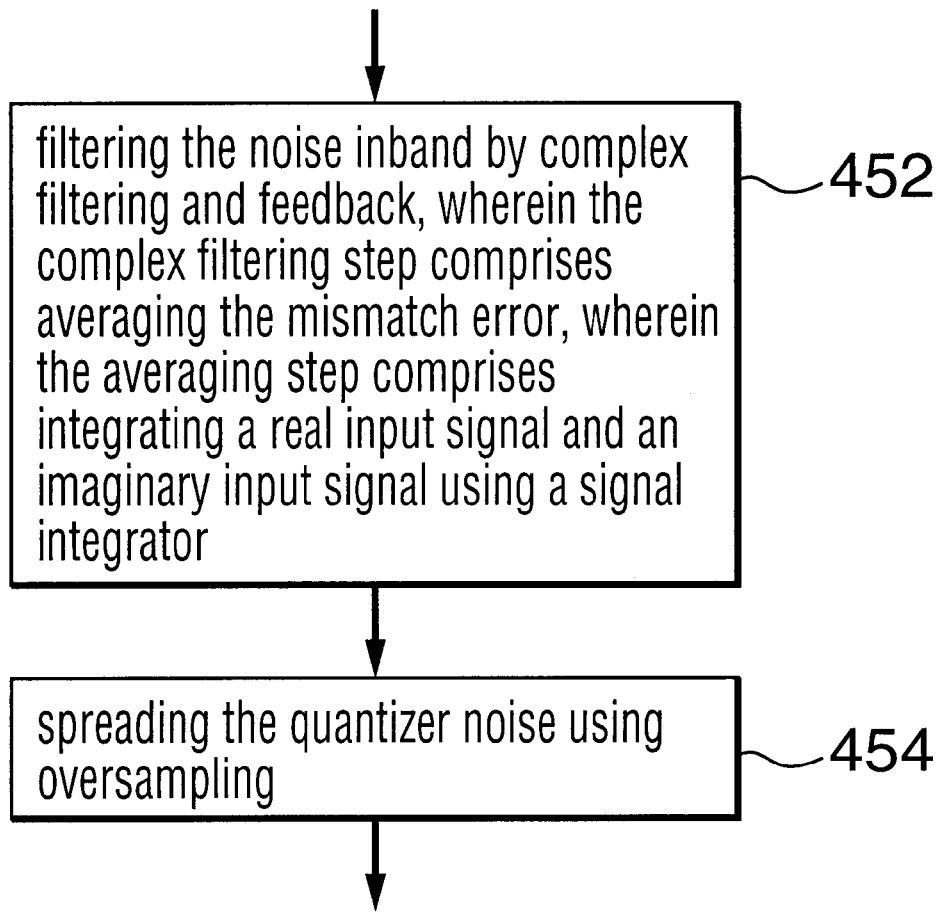
FIG. 14 is a flow chart of an analog signal to digital conversion method according to an embodiment of the invention.

FIG. 7 illustrates a block diagram of a sigma-delta modulation analog to digital converter, according to an embodiment of the invention, incorporated into a receiver system. A delta-sigma modulator 300 includes a summer 304, a feedforward loop filter 306, a quantizer 308 and a digital to analog converter 310. The delta-sigma modulator 300 combined with a first decimator 312 and a second decimator 314 is an analog to digital converter 302.

The digital to analog converter 310 is responsive to the real feedback signal 236 and the imaginary feedback signal 238 and produces the first digital multiplier input signal 232 and the second digital multiplier input signal 234. The first decimator 312 is responsive to the real feedback signal 236 and produces a first decimator output signal 316. The second decimator 314 is responsive to the imaginary feedback signal 238 and produces a second decimator output signal 318.

Alternatively, the embodiment of the invention shown in FIG. 3 or 4 may be used as the feedforward loop filter 306. Also, the embodiment of the invention shown in FIG. 5 may be used as the summer 304, the feedforward loop filter 306 and the quantizer 308.

The operation of the embodiments of the invention is now described.

The flowcharts of FIGS. 8 to 13 illustrate embodiments of complex filtering method of the present invention.

An embodiment of the invention is a complex filtering method for execution in a complex filter having first and second stages, including the following steps:

a. receiving a real input signal and an imaginary input signal, the real and imaginary input signals being associated with mismatch error between the first and second stages of the complex filter;
b. averaging the mismatch error by integrating the real input signal and the imaginary input signal using a single integrator; and
c. outputting an output signal with reduced mismatch error.

Further, step (b) may include averaging the mismatch error by filtering the real and the imaginary input signal using a transfer function substantially equal to $$\frac{1+jz^{-1}}{1-jz^{-1}}.$$

Also, step (b) may also include averaging the mismatch error caused by imperfections in the complex filter by integrating the real input signal and the imaginary input signal using a single integrator.

The embodiments of the invention operate on multiple clocks (rather than the traditional phi1 and phi2 clocks that are normally used in SC circuits). As a brief explanation, the inputs to the A/D (Xre and Xim) are sampled on opposite phases of the clock onto the capacitors $CA_{RE}$ and $CA_{IM}$. This charge is then dumped onto CI1 on the first complete clock cycle, then CI2 oan the next complete clock cycle. During the middle of this charge dumping onto CI1 and CI2, the capacitor is effectively 'flipped' by the cross-coupling switches that are seen in FIG. 5. This serves to effectively make the integrator transfer function look like a band-pass integrator (1/(z+1) transfer function. This is needed because to realize a bandpass notch (not at DC) then a circuit element is needed inside the sigma-delta modulator that has a very large gain at that non-DC frequency. The next two stages work in very similar way to the first stage.

Now, it is important to discuss the feedback inherent to a sigma-delta modulator, specifically by dumping charge from $CB_{RE}$, $CB_{IM}$, $CB2_{RE}$, etc. onto the capacitors, CI1, CI2, etc. This operates with basically the same mechanism as was outlined for the input capacitors above. The one notable difference is that for example, in the case of $CB_{RE}$, the capacitor is charge with a voltage −Yim. But in the process of its charge being transferred to CI1 and CI2, the voltage −Yre is subtracted from it. A very similar thing also happens to the capacitor CBIM. As mentioned above, if there is mismatch between the real (represented in part by $_{RE}$ subscript) and imaginary (represented in part by $_{IM}$ subscript) the performance of this A/D converter is degraded. By having both RE and IM outputs going through the same capacitor, the effect of this mismatch error is reduced. This particular technique is only shown on the first stage of the sigma-delta modulator, but it's application can be used in all stages of this type of complex sigma-delta modulator.

The embodiments of the invention described herein may also operate on two non-overlapping clocks. Furthermore, the switched capacitor filters may be single ended or differential, as is known in the art.

Although the present invention has been described in considerable detail with reference to certain preferred embodiments thereof, other embodiments and modifications are possible, and would be known to those skilled in the art. Therefore, the scope of the appended claims are not limited to the description of the preferred embodiments contained herein.

What is claimed is:

1. A complex filtering method for execution in a complex filter having first and second stages, the method comprising the steps of:
   a. receiving a real input signal and an imaginary input signal, the real and imaginary input signals being associated with mismatch error between the first and second stages of the complex filter;
   b. averaging the mismatch error by integrating the real input signal and the imaginary input signal using a single integrator; and
   c. outputting an output signal with reduced mismatch error.

2. The complex filtering method recited in claim 1 wherein step input signal(b) comprises:
   b. averaging the mismatch error by filtering the real and the imaginary input signal using a transfer function substantially equal to $$\frac{1+jz^{-1}}{1-jz^{-1}}.$$

3. The complex filtering method recited in claim 1 wherein step (b) comprises:
   b. averaging the mismatch error caused by imperfections in the complex filter by integrating the real input signal and the imaginary input signal using a single integrator.

4. The complex filtering method recited in claim 1 wherein the mismatch error averaging step comprises the steps of:
   a. sampling the real input signal and the imaginary input signal on a first capacitor on opposite phases of a clock signal;
   b. integrating the signal charge of the first capacitor using the integrator;
   c. sampling the real input signal and the negative of the imaginary input signal a second capacitor on opposite phases of the clock signal; and
   d. integrating the signal charge of the second capacitor using the integrator.

5. The complex filtering method as recited in claim 4 comprising the steps of:
   a. Sampling the imaginary input signal onto the first capacitor on one cycle of the clock signal and, at the same time, connecting the imaginary input signal to the second capacitor, then integrating using a switched capacitor integrator; and
   b. on the next cycle of the clock signal, connecting the first capacitor to the real input signal and dumping the charge on the first capacitor through the switched capacitor integrator, and, at the same time connecting the real input signal to the second capacitor.

6. A complex filtering method comprising the steps of:
   a. sampling a real input signal onto a first capacitor;
   b. sampling an imaginary input signal onto a second capacitor;
   c. sampling a real feedback signal onto a third capacitor;
   d. sampling an imaginary feedback signal onto a fourth capacitor;
   e. averaging the mismatch error in the third and fourth capacitors;
   f. integrating the first, second, third and fourth capacitors onto a fifth capacitor and a sixth capacitor producing a first stage output signal g. sampling the real input signal onto a sixth capacitor;
h. sampling the imaginary input signal onto a seventh capacitor;
i. sampling the first stage output signal onto an eight capacitor and a ninth capacitor;
j. integrating the sixth, seventh, eighth and ninth capacitors onto a eleventh and a twelve capacitors producing a second stage output signal;
k. sampling the real input signal onto a thirteenth capacitor;
l. sampling the imaginary input signal onto a fourteenth capacitor;
m. sampling the first stage output signal onto an fifteenth capacitor and a sixteenth capacitor;
n. integrating the thirteenth, fourteenth, fifteenth and sixteenth capacitors onto a seventeenth and a eighteenth capacitors producing a third stage output signal; and
o. quantizing the third stage output signal producing a real quantized output signal and an imaginary quantized output signal.

7. An analog signal to digital signal conversion method comprising the steps of:
 a. filtering the noise inband by complex filtering and feedback
  i. wherein the complex filtering step comprises averaging the mismatch error;
   (1) wherein the averaging step comprises integrating a real input signal and an imaginary input signal using a single integrator; and
 b. spreading the quantizer noise using oversampling.

8. A complex filter comprising:
1. means for inputting a first input signal and second input signal;
2. means for outputting a first output signal and a second output signal;
3. a first stage being responsive to the first input signal and the second input signal and producing a first interstage signal with error and a second interstage signal with error, the first stage comprising:
 1. a first delay element being responsive to the first input signal and producing a first delayed signal;
 2. a second delay element being responsive to the second input signal and producing a second delayed signal;
 3. a first summer being responsive to the first input signal and the second delayed signal and producing the first interstage signal with error, the first interstage signal with error being substantially equal to the first input signal minus the second delayed signal; and
 4. a second summer being responsive to the second input signal and the first delayed signal and producing the second interstage signal with error, the second interstage signal with error being substantially equal to the second input signal plus the first delayed signal; and
4. a second stage being responsive to the first interstage signal with error and the second interstage signal with error and producing the first output signal and the second output signal, the second stage comprising:
 1. a third delay element being responsive to the first output signal and producing a third delayed signal;
 2. a fourth delay element being responsive to the second output signal and producing a fourth delayed signal;
 3. a third summer being responsive to the first interstage signal with error and the fourth delayed signal and producing the first output signal, the first output signal being substantially equal to the first interstage signal with error minus the fourth delayed signal; and
 4. a fourth summer being responsive to the second interstage signal with error and the third delayed signal and producing the second output signal, the second output signal being substantially equal to the second interstage signal with error plus the third delayed signal.

9. A sigma-delta modulator comprising:
a. an imaginary input signal, a real input signal and a negated imaginary input signal;
b. an integrated output signal;
c. a clock signal;
d. a first dual switched capacitor resistor being responsive to the clock signal, the imaginary input signal and the real input signal and producing a switched capacitor integrated input signal;
e. a second dual switched capacitor resistor being responsive to the clock signal, the real input signal and the negated imaginary input signal and producing the switched capacitor integrated input signal;
f. a switched capacitor integrator being responsive to the clock signal and the switched capacitor integrated input signal and producing the integrated output signal;
g. a first intermediate filter stage being responsive to the switched capacitor integrator output signal and producing a first intermediate filter stage output signal;
h. a second intermediate filter stage being responsive to the first intermediate filter stage output signal and producing a quantizer input signal;
i. a quantizer being responsive to the quantizer input signal and producing a real quantized output signal and an imaginary quantized output signal;
j. a first digital multiplier being responsive to the first digital multiplier input signal and producing the real feedback signal;
k. a second digital multiplier being responsive to the second digital multiplier input signal and producing the imaginary feedback signal;
l. a third digital multiplier being responsive to the real quantized output signal and producing a third digital multiplier output signal;
m. a fourth digital multiplier being responsive to the imaginary quantized output signal and producing a fourth digital multiplier output signal; and
n. a digital to analog converter being responsive to the real feedback signal and the imaginary feedback signal and producing the first digital multiplier input signal and the second digital multiplier input signal.

10. A complex filter comprising:
a. an imaginary input signal, a real input signal and a negated imaginary input signal;
b. an integrated output signal;
c. a clock signal;
d. a first dual switched capacitor resistor being responsive to the clock signal, the imaginary input signal and the real input signal and producing a switched capacitor integrated input signal;
e. a second dual switched capacitor resistor being responsive to the clock signal, the real input signal and the negated imaginary input signal and producing the switched capacitor integrated input signal; and f. a switched capacitor integrator being responsive to the clock signal and the switched capacitor integrated input signal and producing the integrated output signal.

11. The complex filter recited in claim 10 wherein the first dual switched capacitor resistor comprises:

a. a capacitor, the capacitor having a first capacitor terminal and a second capacitor terminal;

b. a first switch connected between the imaginary input and the first capacitor terminal;

c. a second switch connected between the second capacitor terminal and the switched capacitor input signal;

d. a third switch connected between the real input signal and the first capacitor input terminal;

e. a fourth switch connected between ground and the second capacitor terminal; and f. wherein the first and the fourth switches respond to one phase of the clock signal and the second and the third switches are respond to the other phase of the clock signal.

12. The complex filter recited in claim 10 wherein the second dual switched capacitor resistor comprises:

a. a capacitor, the capacitor having a first capacitor terminal and a second capacitor terminal;

b. a first switch connected between the imaginary input and the first capacitor terminal;

c. a second switch connected between the second capacitor terminal and the switched capacitor input signal;

d. a third switch connected between the real input signal and the first capacitor input terminal;

e. a fourth switch connected between ground and the second capacitor terminal; and f. wherein the first and the fourth switches respond to one phase of the clock signal and the second and the third switches are respond to the other phase of the clock signal.

13. The complex filter recited in claim 10 further comprising:

a. a real feedback signal and an imaginary feedback signal;

b. a first switched capacitor resistor being responsive to the real feedback signal and producing the switched capacitor integrator input signal; and c. a second switched capacitor resistor being responsive to the imaginary feedback signal and producing the switched capacitor integrator input signal.

14. The complex filter recited in claim 13 further comprising:

a. a first intermediate filter stage being responsive to the switched capacitor integrator output signal and producing a first intermediate filter stage output signal.

15. The complex filter recited in claim 14 further comprising:

a. a second intermediate filter stage being responsive to the first intermediate filter stage output signal and producing a quantizer input signal.

16. The complex filter recited in claim 15 further comprising:

a. a quantizer being responsive to the quantizer input signal and producing a real quantized output signal and an imaginary quantized output signal;

b. a first digital multiplier being responsive to the first digital multiplier input signal and producing the real feedback signal;

c. a second digital multiplier being responsive to the second digital multiplier input signal and producing the imaginary feedback signal;

d. a third digital multiplier being responsive to the real quantized output signal and producing a third digital multiplier output signal; and e. a fourth digital multiplier being responsive to the imaginary quantized output signal and producing a fourth digital multiplier output signal.

17. An analog to digital converter comprising:

a. an imaginary input signal, a real input signal and a negated imaginary input signal;

b. an integrated output signal;

c. a clock signal;

d. a first dual switched capacitor resistor being responsive to the clock signal, the imaginary input signal and the real input signal and producing a switched capacitor integrated input signal;

e. a second dual switched capacitor resistor being responsive to the clock signal, the real input signal and the negated imaginary input signal and producing the switched capacitor integrated input signal;

f. a switched capacitor integrator being responsive to the clock signal and the switched capacitor integrated input signal and producing the integrated output signal;

g. a first intermediate filter stage being responsive to the switched capacitor integrator output signal and producing a first intermediate filter stage output signal;

h. a second intermediate filter stage being responsive to the first intermediate filter stage output signal and producing a quantizer input signal;

i. a quantizer being responsive to the quantizer input signal and producing a real quantized output signal and an imaginary quantized output signal;

j. a first digital multiplier being responsive to the first digital multiplier input signal and producing the real feedback signal;

k. a second digital multiplier being responsive to the second digital multiplier input signal and producing the imaginary feedback signal;

l. a third digital multiplier being responsive to the real quantized output signal and producing a third digital multiplier output signal;

m. a fourth digital multiplier being responsive to the imaginary quantized output signal and producing a fourth digital multiplier output signal;

n. a digital to analog converter being responsive to the real feedback signal and the imaginary feedback signal and producing the first digital multiplier input signal and the second digital multiplier input signal;

o. a first decimator being responsive to the real feedback signal and producing a first decimator output signal; and p. a second decimator being responsive to the imaginary feedback signal and producing a second decimator output signal.

18. A complex filter comprising:

a. means for sampling a real input signal onto a first capacitor;

b. means for sampling an imaginary input signal onto a second capacitor;

c. means for sampling a real feedback signal onto a third capacitor;

d. means for sampling an imaginary feedback signal onto a fourth capacitor;

e. means for averaging the mismatch error in the third and fourth capacitors;

f. means for integrating the first, second, third and fourth capacitors onto a fifth capacitor and a sixth capacitor producing a first stage output signal g. means for sampling the real input signal onto a sixth capacitor;

h. means for sampling the imaginary input signal onto a seventh capacitor;

i. means for sampling the first stage output signal onto an eight capacitor and a ninth capacitor;

j. means for integrating the sixth, seventh, eighth and ninth capacitors onto a eleventh and a twelve capacitors producing a second stage output signal;

k. means for sampling the real input signal onto a thirteenth capacitor;

l. means for sampling the imaginary input signal onto a fourteenth capacitor;

m. means for sampling the first stage output signal onto an fifteenth capacitor and a sixteenth capacitor;

n. means for integrating the thirteenth, fourteenth, fifteenth and sixteenth capacitors onto a seventeenth and a eighteenth capacitors producing a third stage output signal; and o. means for quantizing the third stage output signal producing a real quantized output signal and an imaginary quantized output signal.

19. A complex filter comprising:

a. means for receiving a real input signal and an imaginary input signal, the real and imaginary input signals being associated with mismatch error between the first and second stages of the complex filter;

b. means for averaging the mismatch error by integrating the real input signal and the imaginary input signal using a single integrator; and c. means for outputting an output signal with reduced mismatch error.

20. The complex filter recited in claim 19 wherein the mismatch error averaging means comprises:

b. means for averaging the mismatch error by filtering the real and the imaginary input signal using a transfer function substantially equal to $$\frac{1+jz^{-1}}{1-jz^{-1}}.$$

21. The complex filter recited in claim 19 wherein the mismatch error averaging means comprises:

b. means for averaging the mismatch error caused by imperfections in the complex filter by integrating the real input signal and the imaginary input signal using a single integrator.

22. The complex filter recited in claim 19 wherein the mismatch error averaging means comprises:

a. means for sampling the real input signal and the imaginary input signal on a first capacitor on opposite phases of a clock signal;

b. means for integrating the signal charge of the first capacitor using the integrator;

c. means for sampling the real input signal and the negative of the imaginary input signal a second capacitor on opposite phases of the clock signal; and d. means for integrating the signal charge of the second capacitor using the integrator.

23. The complex filter recited in claim 22 further comprising:

a. sampling the imaginary input signal onto the first capacitor on one cycle of the clock signal and, at the same time, connecting the imaginary input signal to the second capacitor, then integrating using a switched capacitor integrator; and a. on the next cycle of the clock signal, connecting the first capacitor to the real input signal and dumping the charge on the first capacitor through the switched capacitor integrator, and, at the same time, connecting the real input signal to the second capacitor.

24. An analog signal to digital converter comprising:

a. means for complex filtering and feedback for filtering the noise inband
   i. wherein the means for complex filtering and feedback comprises means for averaging the mismatch error;
      (1) wherein the means for averaging the mismatch error comprises means for integrating a real input signal and an imaginary input signal using a single integrator; and b. means for oversampling for spreading the quantizer noise.

* * * * *